United States Patent [19]
Gatti

[11] Patent Number: 5,827,074
[45] Date of Patent: Oct. 27, 1998

[54] END MOUNTING TERMINATOR FOR BACKPLANES

[75] Inventor: John Elmer Gatti, Scottsdale, Ariz.

[73] Assignee: Motorola, Inc., Schaumburg, Ill.

[21] Appl. No.: 146,664

[22] Filed: Nov. 1, 1993

[51] Int. Cl.$^6$ .................................................. H05K 1/12
[52] U.S. Cl. ............................................................ 439/61
[58] Field of Search ....................... 439/61, 76; 361/760, 361/736, 785, 803, 788

[56] References Cited

U.S. PATENT DOCUMENTS

| | | | |
|---|---|---|---|
| 3,895,266 | 7/1975 | Geiger | 361/785 |
| 4,134,632 | 1/1979 | Lindberg et al. | 439/55 X |
| 4,934,941 | 6/1990 | Okada | 439/76 |
| 4,936,785 | 6/1990 | Krug et al. | 361/736 X |

*Primary Examiner*—Kenneth J. Ramsey
*Attorney, Agent, or Firm*—S. Kevin Pickens

[57] ABSTRACT

A backplane system provides a terminator assembly that mounts along an axis that is parallel to a plane of the backplane. The backplane system has modular backplanes connected to a removable terminator assembly. Connectors coupled the backplanes to the terminator assembly and each other.

8 Claims, 2 Drawing Sheets

END MOUNTING TERMINATOR FOR BACKPLANES

RELATED INVENTIONS

The present invention is related to the following invention:

(1) "Stackable Computer System", having Ser. No. 29/010,445, filed Jul. 7, 1993, and assigned to the assignee of the present invention.

(2) "Interconnecting Module System", having Ser. No. 08/094,652, filed Jul. 19, 1993, and assigned to the assignee of the present invention.

TECHNICAL FIELD

This invention relates generally to terminators for backplanes and, in particular, to a terminator assembly that mounts along an axis that is parallel to the plane of the backplane.

BACKGROUND OF THE INVENTION

A terminator provides electronic functions associated with a backplane system. The term "terminator" comes from the specific function of a transmission line where components are required at the physical ends of the conductors that make the transmission line. These components are commonly referred to as a termination network. Therefore, a terminator assembly has those functions that are required to be present at the physical ends of a backplane system. An end of the backplane is where the transmission line conductors in the circuit board of the backplane begin or end. Therefore, the ends of the backplane are near or on opposite edges.

If the backplane is to be modular and sections of the transmission line portion are to be optional, then the terminator assembly must be relocated to the physical end of the attached sections of the backplane system. The front and back of a backplane in an electronic system commonly become loaded with other electronic modules and/or cables which is referred to as a payload of the system. Indeed, this is the utility of a backplane. Terminator assemblies mount to the front or back of a backplane near opposite edges in current art.

Separate terminator assemblies for backplanes are common and well known. However, all of these assemblies mount along an axis that is perpendicular or at a right angle to the backplane. The plane of the backplane is that which is established by the surface of the of the backplanes circuit board. These surfaces are referred to commonly and here as the front and back of the backplane. To install or remove the terminator, one had to access the front or rear of the backplane. The motion to engage or disengage the terminator is perpendicular to the front or rear of the backplane. This is not an issue with most electronic systems that employ backplanes due to the fact that the backplanes are seldom expandable. Therefore, in existing art, accessing the terminator is seldom required.

However, when a backplane system is expandable, relocating the terminator assembly presents difficulties in trying to access the terminator and determining where it should be placed. One has to gain access to the terminator assembly by opening the enclosure where the terminator assembly is located. Therefore, there is a significant need for having a terminator assembly that can be easily relocated in a modular backplane system.

SUMMARY OF THE INVENTION

The present invention has utility in mounting a terminator assembly along an axis that is parallel to the plane of the backplane. The terminator assembly mounts at an edge of the backplane.

Thus it is an advantage of the present invention to allow a terminator assembly to be accessed from a surface of an enclosure that is not involved with a functional payload of a backplane that occupies the front or back of the backplane.

Yet another advantage of the present invention is that the existing payload of a system is not disturbed due to the access for backplane expansion and the terminator assembly being on the same surface of the enclosure.

According to one aspect of the invention, a backplane system comprises a backplane comprising a circuit board; and a terminator assembly mounted to the backplane along an axis that is parallel to a largest surface of the circuit board.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DESCRIPTION OF THE PREFERRED EMBODIMENTS

Figure 1:
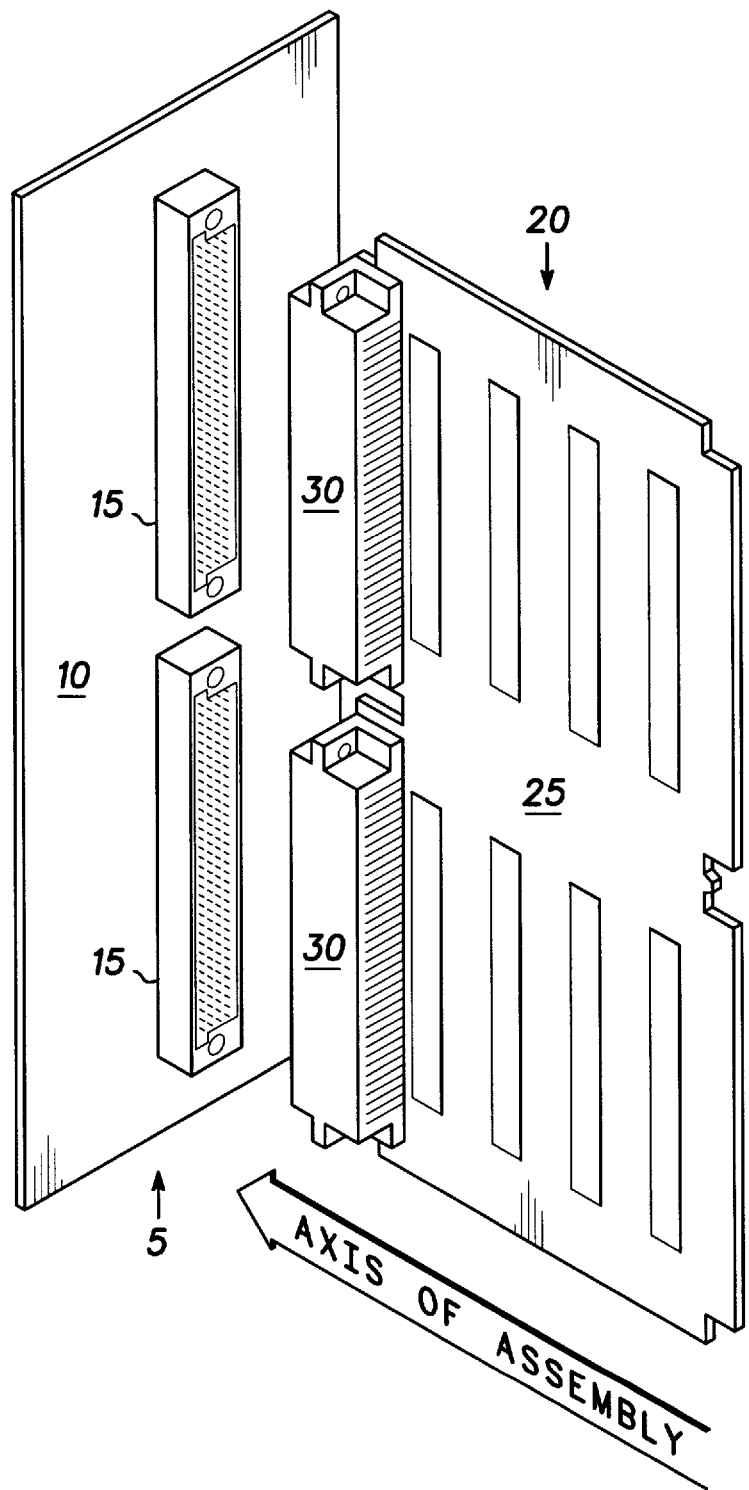
FIG. 1 shows a backplane system in accordance with a preferred embodiment of the present invention.

FIG. 1 shows a backplane system in accordance with a preferred embodiment of the present invention. As shown in FIG. 1, terminator assembly 5 couples to backplane 20 on an axis parallel to the plane of backplane 20. The plane of the backplane is that which is established by the largest surface of the circuit board of the backplanes. The "axis of assembly" as shown in FIG. 1 is in the plane of the backplane.

Various techniques can be used to attach the terminator assembly 5 to backplane 20. The static friction of connectors 15 joined to connectors 30 can be sufficient to attach terminator assembly 5 to backplane 20. In the Series 900, a modular computer system manufactured by Motorola, Inc., a base of the Series 900 secures terminator assembly 5. Each module in the Series 900 which is stackable onto the base secures one backplane 20. When a module is stacked on top of the base, connectors 30 of backplane 20 fastens to or connects into connectors 15 of terminator assembly 5 contained in the base.

As shown in FIG. 1, terminator assembly 5 comprises a circuit board 10 and two connectors 15. Circuit board 10 comprises components such as resistors and capacitors (not shown) which are the termination networks. Terminator assembly 5 provides electronic functions associated with the backplane system.

As shown in FIG. 1, backplane 20 comprises circuit board 25 and a pair of connectors 30. Connectors 40 for the payload or VME boards (also commercially available from Motorola, Inc.) represent connector positions for the normal and typical payload of this backplane and is representative of other backplanes.

Terminator assembly 5 can be accessed from a surface of an enclosure, such as the Series 900 enclosure, that is not involved with the functional payload of a backplane 20 that occupies the front or back of the backplane 20. This becomes very significant when terminator assembly 5 must be removed to allow expansion of backplane 20 by the addition of more backplanes to an existing and functioning system for the purposes of system upgrade or any other reason for system configuration changes.

The payload of a backplane system which encloses terminator assembly 5 to backplane 20 is not disturbed due to the access for backplane expansion and the terminator assembly being on the same surface of the system. This allows, but is not limited to, terminator assembly 5 to be mounted to a part of an enclosure that is removed when expansion is desired, such as the base of the Series 900, for example. When the panel with the terminator assembly 5 is removed, an expansion module containing an additional backplane 20 can be added in its place. Next, the terminator assembly 5 with its enclosure surface is installed to the module that was added. The result is that the existing payload is not disturbed and possibly broken. Moreover, a terminator assembly 5 can not be forgotten to be added to the final backplane system or left in a wrong position. This type of system avoids any possible terminator malfunctions and also reduces the amount of labor required for reconfiguring a backplane system and associated terminator assembly 5.

Terminator assembly 5 is commercially available and manufactured by Motorola, Inc. Backplane 20 is commercially available and manufactured by Mupac Corporation. Connectors 15 and 30 are manufactured by AMP, Inc. or Robinson Nugent, Inc. Any type of terminator assembly 5 or backplane 20 can be used. Moreover, the number of connectors which are used to connect terminator assembly 5 to backplane 20 can also be varied. In addition, the sex of a connector is of no significance because hermaphroditic connector designs will work just as well. In this example, connectors 15 have male electrical contacts and female housings, while connectors 30 is the inverse.

Figure 2:
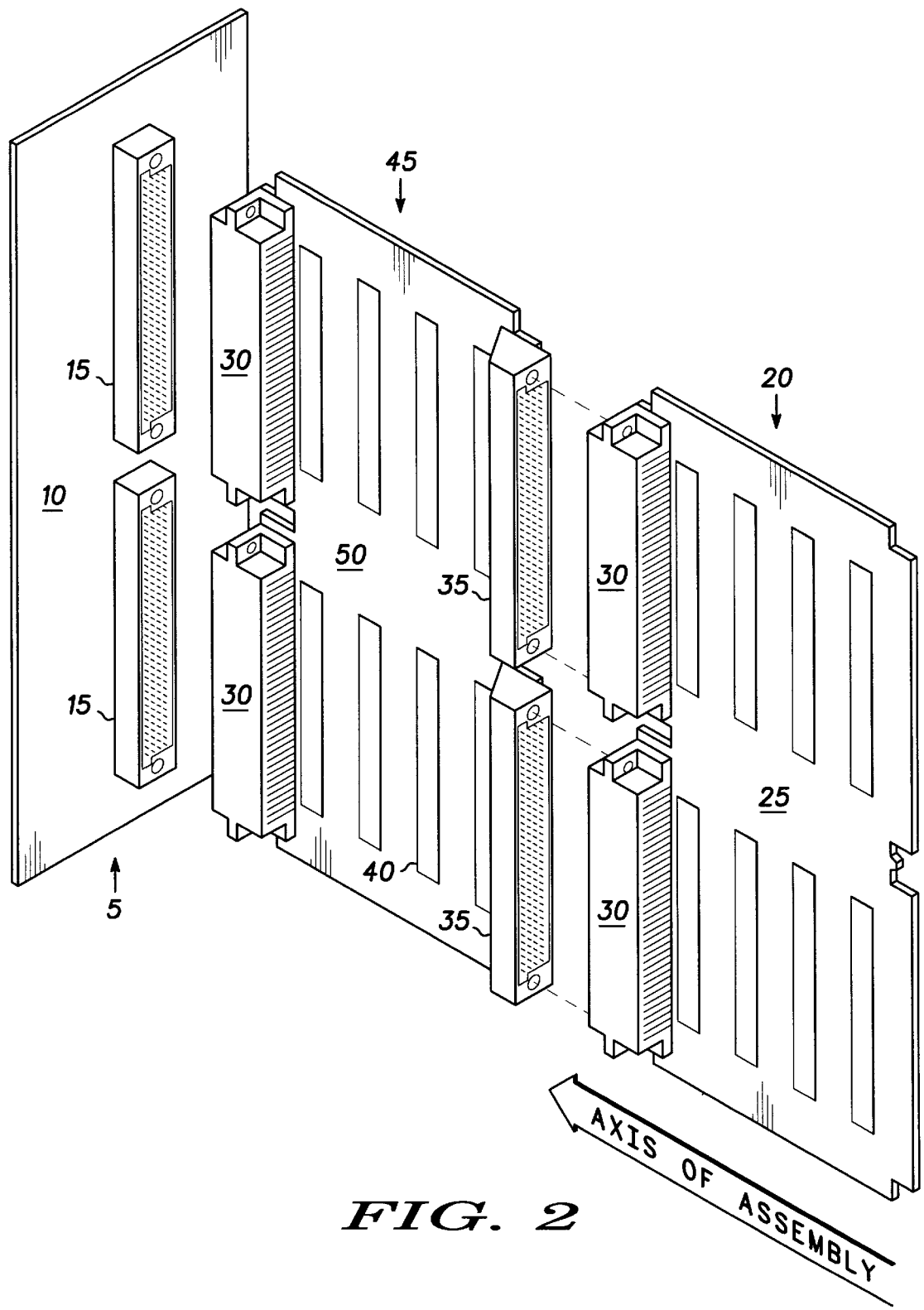
FIG. 2 shows another backplane system having two backplane circuit boards in accordance with a preferred embodiment of the present invention.

FIG. 2 shows an exploded view along an axis of assembly. That axis of assembly is one of the important features of this invention. FIG. 2 shows terminator assembly 5 coupled to expansion backplane 45 which is coupled to backplane 20. Terminator assembly 5 and backplane 20 are described above in relation to the discussion of FIG. 1.

As shown in FIG. 2, backplane 45 is connectable to backplane 20. Expansion backplane 45 illustrates the function provided by having terminator assembly 5 mount along an axis that is parallel to the circuit boards that are the backplanes. Expansion backplane 45 shown in FIG. 2 is similar to backplane 20 shown in FIGS. 1 and 2 except that expansion backplane 45 has a pair of connectors 35. Connectors 35 are located at the top and circuit board 50 so as to connect to connectors 30 of backplane 20. Connectors 30 of expansion backplane 45 are connected to connectors 15 of terminator assembly 5. Backplane 45 is also commercially available and manufactured by Mupac Corporation, while connectors 30, and 35 are commercially available from AMP, Inc. or Robinson Nugent, Inc.

Although circuit board 10, that is part of terminator assembly 5, is perpendicular to the circuit boards of backplanes 20, 45. Circuit board 10 may also be parallel or any other orientation to the circuit boards of the backplane. What is important is that terminator assembly 5 mounts along an axis that is parallel to the backplane or the axis of assembly as shown in FIGS. 1 and 2.

It will be appreciated by those skilled in the art that the present invention provides a way to mount a terminator to a backplane so that it can be easily relocated in a modular backplane system.

Accordingly, it is intended by the appended claims to cover all modifications of the invention which fall within the true spirit and scope of the invention.

What is claimed is:

1. A backplane system comprising:
    a backplane comprising a circuit board having multiple connectors located at the surface of the circuit board for receiving removable payload assemblies therein which payload assemblies are perpendicular to said surface of the circuit board, said circuit board further having at least one connector mounted to the end thereof in which the receiving portion of said at least one connector is located in a plane that is parallel to said surface of said circuit board: and
    a terminator assembly separate from said backplane and having at least one connector which mates to said at least one connector of said backplane in said plane parallel to said surface of the circuit board wherein said backplane can be removably installed to said terminator assembly without disturbing said payload assemblies.

2. A backplane system as recited in claim 1, wherein the terminator assembly comprises:
    a second circuit board; and
    a plurality of connectors, each mounted to the second circuit board.

3. A backplane system as recited in claim 1, wherein the terminator comprises:
    a second circuit board; and
    a plurality of second connectors mounted to the second circuit board,
    the second connectors connecting to the connectors of the backplane along an axis that is parallel to the plane of the backplane.

4. A backplane system as recited in claim 1, further comprising:
    a plurality of backplanes connected to each other and the backplane.

5. A backplane system as recited in claim 4, wherein each of the backplanes comprises:
    a backplane circuit board; and
    a plurality of connectors mounted to the backplane circuit board,
    the backplanes connecting to each other using the connectors.

6. A backplane system comprising:
    a backplane circuit board;
    a plurality of backplane connectors mounted to the circuit board;
    a terminator circuit board; and
    a plurality of terminator connectors mounted to the terminator circuit board,
    the terminator connectors coupling to the backplane connectors along an axis that is parallel to the plane of the backplane connectors.

7. A backplane system comprising:
    a backplane comprising,
        a backplane circuit board, and
        a plurality of backplane connectors mounted to the backplane circuit board; and
    a terminator comprising,
        a terminator circuit board, and
        a plurality of terminator connectors mounted to the terminator circuit board,
    the terminator connectors coupling to the backplane connectors along an axis that is parallel to the plane of the backplane connectors.

8. A backplane system as recited in claim 7, further comprising:

a plurality of backplanes, each comprising,
a backplane circuit board, and
a plurality of backplane connectors mounted to the backplane circuit board,
the backplane connectors coupling to each other along an axis that is parallel to the plane of the backplane.

* * * * *